United States Patent
Morioka et al.

(10) Patent No.: US 8,136,820 B2
(45) Date of Patent: Mar. 20, 2012

(54) ELECTROSTATIC CHUCK WITH HEATER AND MANUFACTURING METHOD THEREOF

(75) Inventors: Ikuhisa Morioka, Handa (JP); Kazuhiro Nobori, Handa (JP); Tetsuya Kawajiri, Handa (JP); Akiyoshi Hattori, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1247 days.

(21) Appl. No.: 11/841,172

(22) Filed: Aug. 20, 2007

(65) Prior Publication Data
US 2008/0049374 A1 Feb. 28, 2008

(30) Foreign Application Priority Data
Aug. 22, 2006 (JP) .................................. 2006-225813

(51) Int. Cl.
*B23B 31/28* (2006.01)
*H01L 21/683* (2006.01)

(52) U.S. Cl. .......................... 279/128; 361/234; 428/698

(58) Field of Classification Search ................... 279/128; 361/234; 118/500, 730; 156/345.23; 392/416, 392/418; 428/698; *B23B 31/28; H01L 21/683*
See application file for complete search history.

(56) References Cited

U.S. PATENT DOCUMENTS

| | | | |
|---|---|---|---|
| 6,507,006 B1 * | 1/2003 | Hiramatsu et al. | 219/444.1 |
| 6,617,514 B1 | 9/2003 | Ushikoshi et al. | |
| 6,677,557 B2 * | 1/2004 | Ito et al. | 219/465.1 |
| 6,753,601 B2 * | 6/2004 | Hiramatsu et al. | 257/703 |
| 6,825,555 B2 * | 11/2004 | Hiramatsu et al. | 257/705 |
| 6,888,106 B2 * | 5/2005 | Hiramatsu | 219/444.1 |
| 6,888,236 B2 * | 5/2005 | Hiramatsu et al. | 257/703 |
| 6,891,263 B2 * | 5/2005 | Hiramatsu et al. | 257/703 |
| 6,964,812 B2 * | 11/2005 | Ito et al. | 428/408 |
| 7,338,723 B2 | 3/2008 | Hattori | |
| 7,387,977 B2 * | 6/2008 | Mori et al. | 501/127 |
| 7,701,693 B2 * | 4/2010 | Hattori et al. | 361/234 |
| 7,848,075 B2 * | 12/2010 | Nobori et al. | 361/234 |
| 2002/0150789 A1 * | 10/2002 | Hiramatsu et al. | 428/688 |
| 2003/0054147 A1 * | 3/2003 | Niwa | 428/209 |
| 2005/0014628 A1 * | 1/2005 | Yoshikawa et al. | 501/95.2 |
| 2005/0215415 A1 * | 9/2005 | Hattori | 501/98.4 |
| 2006/0169688 A1 * | 8/2006 | Mori et al. | 219/444.1 |

FOREIGN PATENT DOCUMENTS

| | | |
|---|---|---|
| JP | 11-012053 A1 | 1/1999 |
| JP | 2001-223256 A1 | 8/2001 |
| JP | 2005-281046 A1 | 10/2005 |
| WO | 2005/008749 A1 | 1/2005 |

* cited by examiner

*Primary Examiner* — Eric A Gates
(74) *Attorney, Agent, or Firm* — Burr & Brown

(57) ABSTRACT

An electrostatic chuck with a heater includes: a base formed of a sintered body containing alumina; an ESC electrode provided in an upper portion side in the base; and a resistance heating body embedded in a lower portion side in the base. The base is composed of a dielectric layer from the ESC electrode to an upper surface of the base, and of a support member from the ESC electrode to a lower surface of the base. In the support member, a carbon content differs between an ESC electrode neighborhood in contact with the dielectric layer and a lower region below the ESC electrode neighborhood, a carbon content in the dielectric layer is 100 wt ppm or less, the carbon content in the ESC electrode neighborhood is 0.13 wt % or less, the carbon content in the lower region is 0.03 wt % or more and 0.5 wt % or less, and the carbon content in the ESC electrode neighborhood is smaller than the carbon content in the lower region. The resistance heating body contains niobium or platinum.

3 Claims, 3 Drawing Sheets

ELECTROSTATIC CHUCK WITH HEATER AND MANUFACTURING METHOD THEREOF

CROSS-REFERENCE TO RELATED APPLICATION

This application is based upon and claims the benefit of priority from Patent Application No. 2006-225813 filed on Aug. 22, 2006, in the Japanese Patent Office, of which contents are incorporated herein by reference.

BACKGROUND OF THE INVENTION

1. Field of the Invention

The present invention relates to an electrostatic chuck with a heater, which is for use in a manufacturing process of a semiconductor device, and the like, and to a manufacturing method of the electrostatic chuck with a heater.

2. Description of the Related Art

Heretofore, in the case of manufacturing a semiconductor device and the like, surface treatment such as deposition and etching has been implemented for a semiconductor wafer. As one of apparatuses that hold the semiconductor wafer during the surface treatment, there is an electrostatic chuck. The electrostatic chuck has a substrate mounting surface on which a substrate such as the semiconductor wafer is mounted. The electrostatic chuck holds the substrate on the substrate mounting surface by electrostatic force generated on the substrate mounting surface. In the electrostatic chuck, there is an electrostatic chuck of a type using Coulomb force as the electrostatic force. Moreover, as a type of this electrostatic chuck, there is an electrostatic chuck with a heater, which includes the heater, and heats up the semiconductor wafer.

A typical example of such a Coulomb-type electrostatic chuck with a heater includes a base made of ceramics. In the base, there are provided: an electrostatic chuck electrode (hereinafter, referred to as an "ESC electrode") for generating the electrostatic force between the electrostatic chuck and the substrate mounted on the substrate mounting surface; and a resistance heating body for heating up the substrate. Moreover, an upper surface of the base is formed into the substrate mounting surface on which the substrate such as the wafer is mounted. Then, a portion from the ESC electrode to the substrate mounting surface in the base is formed as a dielectric layer, and a portion from the ESC electrode to a lower surface of the base is formed as a support member (for example, refer to Japanese Patent Laid-Open Publication No. H11-12053 (published in 1999)). The Coulomb-type electrostatic chuck is one to suck the substrate by using electrostatic suction force (Coulomb force) generated between the substrate mounted on a surface of the dielectric layer of the electrostatic chuck, that is, on the substrate mounting surface, and the ESC electrode of the electrostatic chuck.

In the Coulomb-type electrostatic chuck with a heater, aluminum nitride has been used for the ceramics of the base (for example, refer to Japanese Patent Laid-Open Publication No. H11-12053 (published in 1999) mentioned above).

In the conventional electrostatic chuck with a heater, in which aluminum nitride has been used for the ceramics of the base, volume resistivity of the dielectric layer is small, and accordingly, there has been an apprehension that a detachment response for the substrate mounted on the substrate mounting surface may be decreased.

Accordingly, it is considered to apply alumina higher in volume resistivity and also in corrosion resistance than aluminum nitride. In this case, for the resistance heating body, it is preferable to use niobium (Nb) and the like, which are similar in thermal expansion coefficient to alumina. However, when the resistance heating body contains niobium (Nb), there has been an apprehension that a niobium component of the resistance heating body is diffused into the support member in which the resistance heating body is embedded. The niobium component is diffused into the support member, whereby resistance characteristics of the resistance heating body are changed, and accordingly, there has been an apprehension that a malfunction occurs, that heating performance for the substrate, which should be uniform, is varied.

Moreover, in the electrostatic chuck, the suction force for the substrate is increased as a voltage applied to the ESC electrode is becoming higher; however, there has been an apprehension that a high voltage of approximately several thousand volts, which becomes necessary in the electrostatic chuck using the Coulomb force, may cause a dielectric breakdown and the like.

In this connection, it is an objective of the present invention to provide an electrostatic chuck with a heater, which enhances the detachment response for the substrate mounted on the substrate mounting surface, does not cause the dielectric breakdown even if the suction force is increased by being applied with the high voltage, and can uniformly heat up the substrate, and to provide a manufacturing method of the electrostatic chuck with a heater.

SUMMARY OF THE INVENTION

In order to achieve the above-described objective, an electrostatic chuck with a heater includes: a base formed of a sintered body containing alumina; an electrostatic chuck electrode provided in an upper portion side in the base; and a resistance heating body embedded in a lower portion side in the base, wherein the base is composed of a dielectric layer from the electrostatic chuck electrode to an upper surface of the base, and of a support member from the electrostatic chuck electrode to a lower surface of the base, a carbon content in the dielectric layer is 100 wt ppm or less, a carbon content in the support member differs between an electrostatic chuck electrode neighborhood in contact with the dielectric layer and a lower region below the electrostatic chuck electrode neighborhood, the carbon content in the electrostatic chuck electrode neighborhood of the support member is 0.13 wt % or less, the carbon content in the lower region of the support member is 0.03 wt % or more and 0.5 wt % or less, the carbon content in the electrostatic chuck electrode neighborhood is smaller than the carbon content in the lower region, and the resistance heating body contains niobium or platinum.

Moreover, a manufacturing method of an electrostatic chuck with a heater for manufacturing the above-mentioned electrostatic chuck includes the steps of: forming a dielectric layer of a base by firing a raw material of ceramics; forming an electrostatic chuck electrode; and forming a support member by firing a raw material of ceramics, in which a resistance heating body is embedded, wherein the step of forming a support member includes the step of adjusting a carbon content in a sintered body of the support member by arranging a raw material of ceramics with a carbon content of 0.03 wt % or more on the side close to the electrostatic chuck electrode, and a raw material of ceramics with a smaller carbon content than the carbon content of the side close to the electrostatic chuck electrode, on a side apart from the electrostatic chuck electrode, followed by stacking and press forming.

According to the electrostatic chuck with a heater and the manufacturing method of the electrostatic chuck with a heater in accordance with the present invention, the support member of the base is composed of ceramic containing alumina in which the carbon content differs between the ESC electrode neighborhood and the lower region. Accordingly, it becomes possible to enhance the anti-dielectric breakdown characteristics in the ESC electrode portion while preventing the variations of the heating characteristics owing to the diffusion of the resistance heating body.

BRIEF DESCRIPTION OF THE DRAWINGS

The above and further objectives, features and advantages of the invention will more fully appear in the detailed description of embodiments of the invention, when the same is read is conjunction with the drawings, in which.

DETAILED DESCRIPTION OF THE INVENTION

A description will be made below of embodiments of an electrostatic chuck with a heater in accordance with the present invention by using the drawings.

Figure 1:
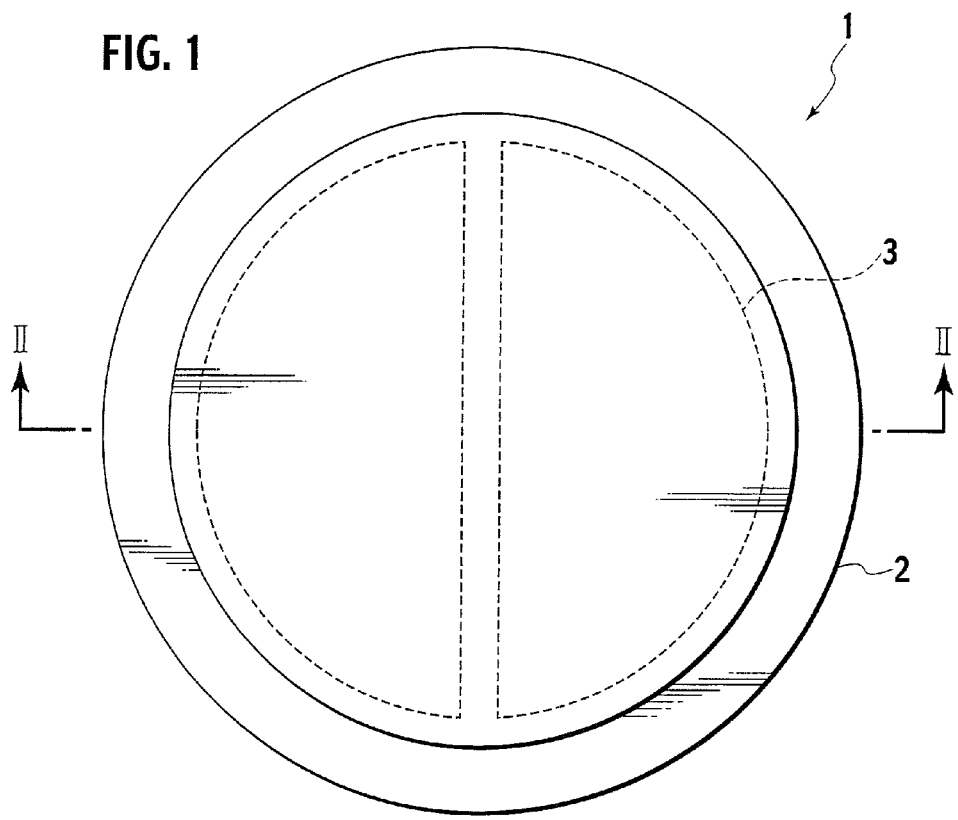
FIG. 1 is a plane view showing an embodiment according to an electrostatic chuck with a heater in accordance with the present invention.
Figure 2:
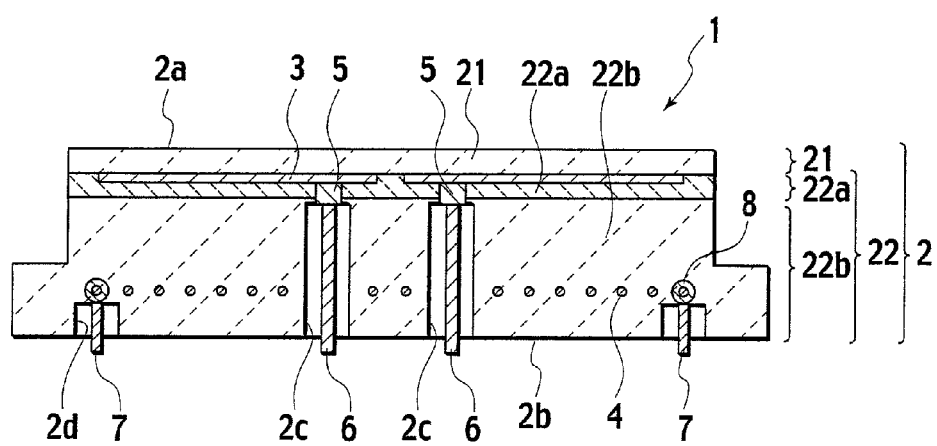
FIG. 2 is a cross-sectional view along a line II-II of FIG. 1.

FIG. 1 is a plane view showing an embodiment according to the electrostatic chuck with a heater in accordance with the present invention, and FIG. 2 is a cross-sectional view along a line II-II of FIG. 1. The electrostatic chuck 1 with a heater, which is shown in FIG. 1 and FIG. 2, includes a base 2 having a substantial disc shape. This base 2 is composed of a ceramic sintered body containing alumina as a main component. The electrostatic chuck 1 is an example where ESC electrodes 3 have a bipolar configuration. However, the electrostatic chuck with a heater in accordance with the present invention is not limited to the example of including such bipolar ESC electrodes 3 shown in the drawings, and may be one including a unipolar ESC electrode, or tripolar or more ESC electrodes.

An upper surface of the base 2 becomes a substrate mounting surface 2a on which a semiconductor wafer or the like to be held by the electrostatic chuck 1 is mounted. In an inside of the base 2, the ESC electrodes 3 for generating electrostatic force are embedded in parallel and close to the substrate mounting surface 2a. Moreover, on a lower side of the ESC electrodes 3 in the inside of the base 2, a resistance heating body 4 is embedded. Although details of the resistance heating body 4 will be described later, the resistance heating body 4 can be made of a material similar in thermal expansion coefficient to alumina as the main component of the base 2, for example, can be made of niobium.

ESC electrode connection holes 2c are formed from a lower surface 2b of the base 2 toward the ESC electrodes 3, and heating body connection holes 2d are formed therefrom toward the resistance heating body 4. On bottom surfaces of the ESC electrode connection holes 2c, connection members 5 embedded in the base 2 and connected to the ESC electrodes 3, are exposed. The connection members 5 are made of a conductive material. ESC electrode power feeding members 6 for supplying electric power from an outside are inserted into the ESC electrode connection holes 2c, and the ESC electrode power feeding members 6 are connected to the connection members 5. In such a way, the ESC electrode power feeding members 6 are electrically connected to the ESC electrodes 3 through the connection members 5. Moreover, heating body power feeding members 7 are inserted into the heating body connection holes 2d, and the heating body power feeding members 7 are connected to connection members 8 exposed on bottom surfaces of the heating body connection holes 2d. In such a way, the heating body power feeding members 7 are electrically connected to the resistance heating body 4 through the connection members 8.

With regard to the base 2 made of ceramics containing alumina as the main component, a region thereof from the substrate mounting surface 2a to the ESC electrodes 3 becomes a dielectric layer 21, and a region thereof from the ESC electrodes 3 to the lower surface 2b of the base becomes a support member 22 that supports the dielectric layer 21. In order to generate Coulomb force suitable for holding the substrate, it is necessary that the dielectric layer 21 be ceramics having predetermined volume resistivity. Therefore, the dielectric layer 21 of this embodiment is made of alumina containing the smallest amount of carbon that reduces the volume resistivity, and specifically, is made of alumina with a carbon content of 100 wt ppm or less.

The support member 22 that supports the dielectric layer 21 is made of a material containing alumina as a main component. In the support member 22, an ESC electrode neighborhood 22a including a region in contact with the ESC electrodes 3 is different in carbon content from a lower region 22b as a region under the ESC electrode neighborhood 22a. More specifically, a carbon content of this electrostatic chuck electrode neighborhood 22a is smaller than a carbon content of the lower region 22b, and under this condition, the carbon content of the ESC electrode neighborhood 22a is 0.13 wt % or less, and the carbon content of the lower region 22b is 0.03 wt % or more.

A description will be made of the carbon contents of the ESC electrode neighborhood 22a and the lower region 22b.

The support member 22 that supports the dielectric layer 21 is rigidly attached onto the dielectric layer 21, thereby forming the integral base 2. Therefore, it is preferable that a material of the support member 22 be the same type of alumina as that of the dielectric layer 21. This is because, when the support member 22 is formed of a different type of material from that of the dielectric layer 21, that is, a material different therefrom in thermal expansion coefficient, a thermal stress occurs on a bonded interface between the dielectric layer 21 and the support member 22.

However, when the support member 22 is made only of alumina that contains the smallest amount of carbon in a similar way to the dielectric layer 21, the niobium component of the resistance heating body 4 embedded in the support member 22 is diffused into alumina of the support member 22 in the periphery of the resistance heating body 4, and as a result, there is an apprehension that resistance characteristics of the resistance heating body 4 may be changed. Accordingly, the lower region 22b that covers the periphery of the resistance heating body 4 is made of alumina containing carbon that can suppress the diffusion of niobium, and specifically, is made of alumina with a carbon content of 0.03 wt % or more.

Moreover, by researches of the inventors, it turned out that it is recommended to suppress, to 0.13 wt % or less, the carbon content of the ESC electrode neighborhood 22a including the region in contact with the ESC electrodes 3 in the support member 22 in order to enhance anti-dielectric breakdown characteristics of the ESC electrodes 3, and in order to prevent an adverse effect to the dielectric layer 21 by such diffusive movement of carbon contained in alumina.

As described above, in the electrostatic chuck 1 of this embodiment, the base 2 is made of ceramics containing alumina, the carbon content of the dielectric layer 21 is 100 wt ppm or less, the carbon content of the ESC electrode neighborhood 22a of the support member 22 is 0.13 wt % or less, and the carbon content of the lower region 22b is 0.03 wt % or more. Because of these facts, as a Coulomb-type electrostatic chuck, the electrostatic chuck 1 of this embodiment has excellent detachment characteristics owing to high volume resistivity of alumina composing the dielectric layer 21. Moreover, the lower region 22b of the support member 22 contains the predetermined amount of carbon, whereby the electrostatic chuck 1 of this embodiment can suppress the diffusion of niobium into alumina of the resistance heating body 4, exerts a stable resistance distribution, and generates Joule heat uniformly. From these facts, the electrostatic chuck 1 of this embodiment is excellent in temperature controllability. Moreover, the carbon amount of the ESC electrode neighborhood 22a of the support member 22 is suppressed, and accordingly, the electrostatic chuck 1 of this embodiment can suppress the dielectric breakdown between the ESC electrodes 3. From this fact, it is possible to apply a high voltage to the electrostatic chuck 1 of this embodiment, and accordingly, the electrostatic chuck 1 has high suction characteristics, and can prevent arcing to members, which are adjacent to the electrostatic chuck 1. Therefore, reliability of the electrostatic chuck 1 is further enhanced. Effects of preventing the dielectric breakdown and prevent such arcing, which are inherent in the electrostatic chuck 1 of this embodiment, become a large advantage particularly in the case of increasing suction force by applying a high voltage to the ESC electrodes 3.

The reason why the carbon content in the dielectric layer 21 is numerically limited to 100 wt ppm or less is to provide suitable volume resistivity to such a Coulomb-type electrostatic chuck. When the carbon content in the dielectric layer 21 exceeds 100 wt ppm, it becomes difficult for the electrostatic chuck to include intended high volume resistivity. Since the volume resistivity of the dielectric layer is high, the electrostatic chuck in accordance with the present invention can reduce electric charges remaining in the dielectric layer when the high voltage is applied to the ESC electrodes, can suppress the suction for the substrate by the residual electric charges when the voltage is released, and can perform the detachment of the substrate in an extremely short time.

The reason why the carbon content in the ESC electrode neighborhood 22a of the support member 22 is set at 0.13 wt % or less is to enhance the anti-dielectric breakdown characteristic of the ESC electrodes 3 by suppressing the carbon amount in the support member 22 in the region adjacent thereto, and to prevent an occurrence of the adverse effect to the dielectric layer 21 by the diffusive movement of carbon in alumina. When the carbon content in the ESC electrode neighborhood 22a exceeds 0.13 wt %, there is an apprehension that insulating characteristics between the ESC electrodes 3 may drop owing to conductivity of carbon, resulting in an occurrence of the dielectric breakdown. More preferable carbon content is 0.10 wt % or less. Moreover, it is also possible to reduce the carbon content in the ESC electrode neighborhood 22a to the same extent as the above-described carbon content in the dielectric layer 21.

The reason why the carbon content of the lower region 22b of the support member 22 is set at 0.03 wt % or more is to suppress the diffusion of the niobium component of the resistance heating body 4 into alumina. When the carbon content of the lower region 22b is less than 0.03 wt % or less, the effect of suppressing the diffusion of the niobium component becomes insufficient. More preferable carbon content is 0.10 wt % or more. Note that it is preferable to set an upper limit of the carbon content of the lower region 22b at approximately 0.5 wt % or less from a viewpoint of preventing a leak current caused by the decrease of the volume resistivity.

A thickness of the ESC electrode neighborhood 22a of the support member 22 of the base 2 just needs to be approximately a few millimeters, which is a sufficient thickness from a viewpoint of suppressing the dielectric breakdown. Moreover, a thickness of the ESC electrode neighborhood 22a may be a few millimeters or more.

Figure 3:
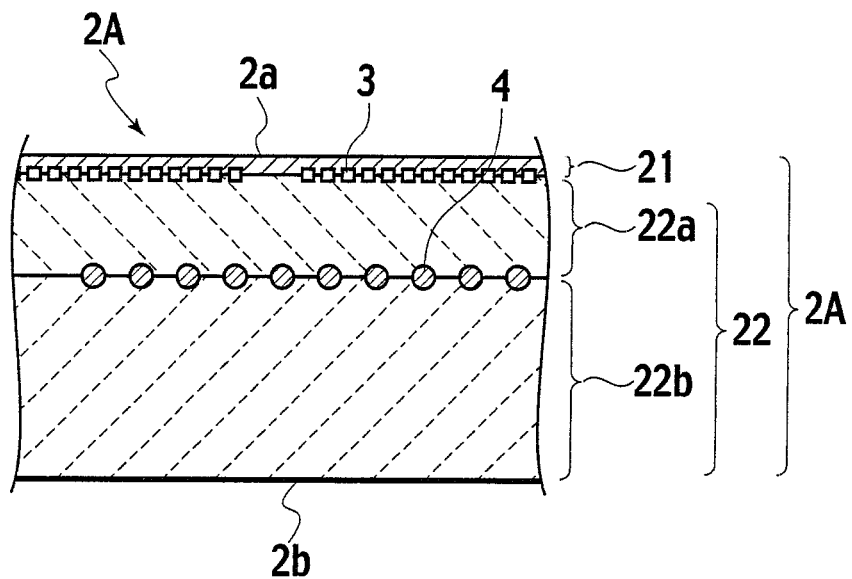
FIG. 3 is a main portion cross-sectional view showing another embodiment of the electrostatic chuck with a heater.
Figure 4:
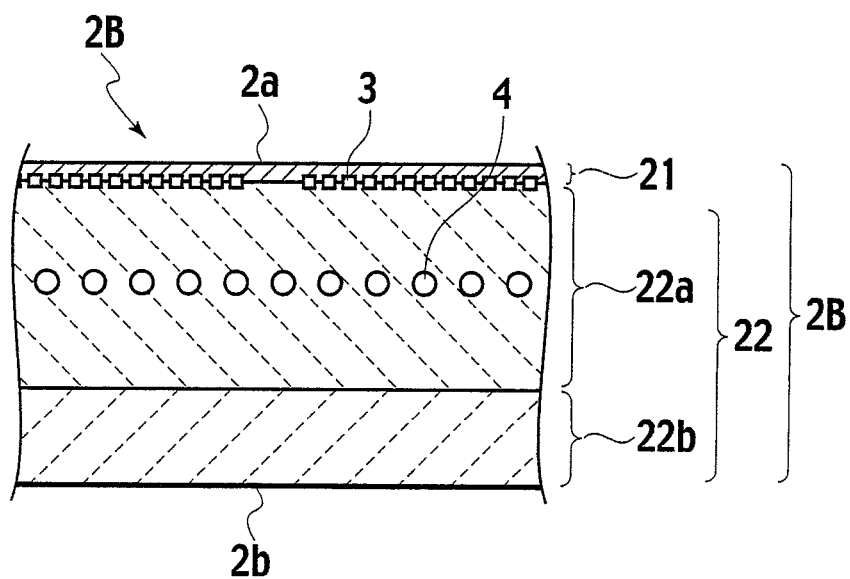
FIG. 4 is a main portion cross-sectional view showing still another embodiment of the electrostatic chuck with a heater.

In FIG. 3 and FIG. 4, other embodiments of the electrostatic chuck, in which a range of the ESC electrode neighborhood 22a is differentiated, are shown individually by main portion cross-sectional views of the base 2.

A base 2A shown in FIG. 3 includes the dielectric layer 21 from the substrate mounting surface 2a to the ESC electrodes 3, and includes the support member 22. The support member 22 is composed of the ESC electrode neighborhood 22a that occupies a region from the ESC electrodes 3 to the resistance heating body 4, and the lower region 22b that occupies a region from the resistance heating body 4 to the lower surface 2b. Specifically, in comparison with the base 2 in the embodiment shown in FIG. 1 and FIG. 2, the base 2A in FIG. 3 is different wherefrom in that the ESC electrode neighborhood 22a is expanded to the region in contact with the resistance heating body 4. Other configurations of the base 2A are the same as those of the base 2. Hence, a duplicate description of the same configurations as those in the embodiment shown in FIG. 1 and FIG. 2 and functions/effects thereof will be omitted.

In the embodiment shown in FIG. 3, the ESC electrode neighborhood 22a is formed in a range from the ESC electrodes 3 to the resistance heating body 4, whereby it becomes possible to suppress the dielectric breakdown of the ESC electrodes 3 more surely than in the embodiment shown in FIG. 2 while suppressing the diffusion of the niobium component of the resistance heating body 4. An effect from the above will be described below in detail. The carbon content in alumina of the ESC electrode neighborhood 22a is smaller than the carbon content in the lower region 22b. When the ESC electrode neighborhood 22a and the lower region 22b, which are different in carbon content from each other as described above, are brought into mutual contact to form the support member 22, carbon contained in the lower region 22b is diffused and moved to the ESC electrode neighborhood 22a by a high temperature of the time when the electrostatic chuck with a heater is manufactured. As a result, carbon of approximately the same carbon content as that of the lower region 22b or less is contained in alumina in the periphery of the resistance heating body 4, and accordingly, the diffusion of niobium of the resistance heating body 4 can be suppressed sufficiently. Moreover, in the embodiment shown in FIG. 3, a distance between the ESC electrodes 3 and the lower region 22b is larger than in the embodiment shown in FIG. 1 and FIG. 2. Therefore, even if carbon contained in the lower region 22b is diffused and moved to the ESC electrode neighborhood 22a by the high temperature of the time when the electrostatic chuck with a heater is manufactured, in the embodiment shown in FIG. 3, an increase of the carbon content in alumina at the portion in contact with the ESC electrodes 3 is smaller than in the embodiment shown in FIG. 2 since a moving distance of carbon is lengthened, and as a result, it becomes possible to further suppress the dielectric breakdown.

Next, a description will be made of another embodiment of the electrostatic chuck by using the main portion cross-sectional view of a base 2B shown in FIG. 4. The base 2B shown in FIG. 4 includes the dielectric layer 21 from the substrate mounting surface 2a to the ESC electrodes 3, and includes the support member 22. The support member 22 is composed of the ESC electrode neighborhood 22a that occupies a region extended from the ESC electrodes 3 through the resistance heating body 4 to a lower side portion of the resistance heating body 4, and of the lower region 22b that occupies a region from a lower end of the ESC electrode neighborhood 22a to the lower surface 2b. Specifically, in comparison with the embodiment shown in FIG. 1 and FIG. 2 and the embodiment shown in FIG. 3, which are mentioned above, the embodiment shown in FIG. 4 is different wherefrom in that the ESC electrode neighborhood 22a is extended through the resistance heating body 4 to the lower side portion thereof. Other configurations in the embodiment shown in FIG. 4 are the same as those in the above-described embodiments. Hence, a duplicate description of the same configurations as those in the embodiments shown in FIG. 1, FIG. 2 and FIG. 3 and functions/effects thereof will be omitted.

In the embodiment shown in FIG. 4, the ESC electrode neighborhood 22a is formed in a range from the ESC electrodes 3 through the resistance heating body 4 to the lower side portion of the resistance heating body 4, whereby it becomes possible to suppress the diffusion of the niobium component of the resistance heating body 4 while suppressing the dielectric breakdown of the ESC electrodes 3 more surely than in the embodiment shown in FIG. 3. An effect from the above is similar to the effect already described in the embodiment of FIG. 3. Specifically, the carbon content in alumina of the ESC electrode neighborhood 22a is smaller than the carbon content in the lower region 22b. When the ESC electrode neighborhood 22a and the lower region 22b, which are different in carbon content from each other as described above, are brought into mutual contact to form the support member 22, carbon contained in the lower region 22b is diffused and moved to the ESC electrode neighborhood 22a by the high temperature of the time when the electrostatic chuck with a heater is manufactured. As a result, carbon of approximately the same carbon content as that of the lower region 22b or less is contained in alumina in the periphery of the resistance heating body 4, and accordingly, the diffusion of niobium of the resistance heating body 4 can be suppressed sufficiently. Moreover, in the embodiment shown in FIG. 4, the distance between the ESC electrodes 3 and the lower region 22b is larger than in the embodiment shown in FIG. 3. Therefore, even if carbon contained in the lower region 22b is diffused and moved to the ESC electrode neighborhood 22a by the high temperature of the time when the electrostatic chuck with a heater is manufactured, in the embodiment shown in FIG. 4, the increase of the carbon content in alumina at the portion in contact with the ESC electrodes 3 is smaller than in the embodiment shown in FIG. 3 since the moving distance of carbon is lengthened, and as a result, it becomes possible to further suppress the dielectric breakdown.

Figure 5:
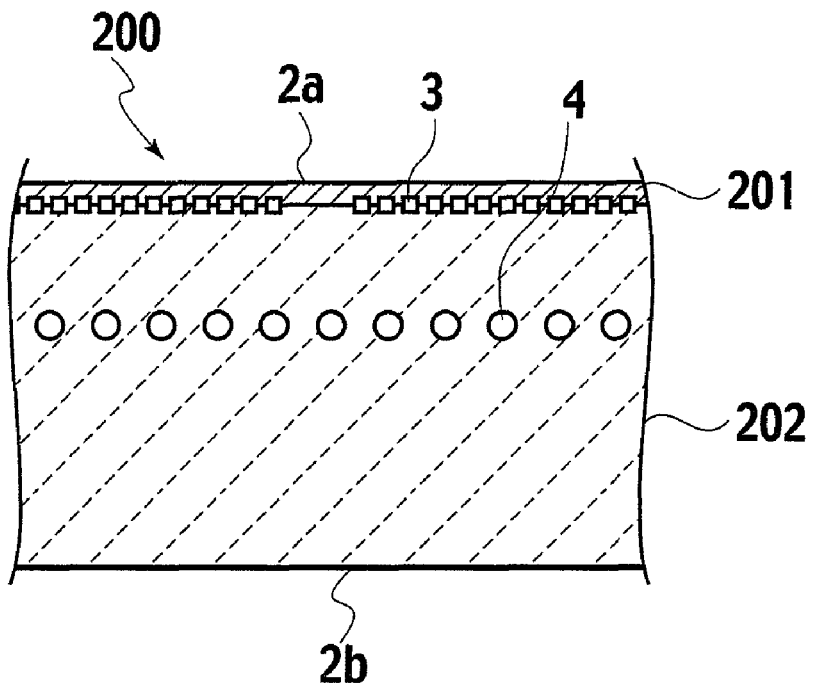
FIG. 5 is a main portion cross-sectional view of a base of a comparative example.

For comparison with the embodiments shown in FIGS. 1 to 4, a comparative example of the electrostatic chuck is shown in FIG. 5 by a main portion cross-sectional view of a base 200. The base 200 shown in FIG. 5 includes a dielectric layer 201 from the substrate mounting surface 2a to the ESC electrodes 3, and in addition, includes a support member 202 in contact with the ESC electrodes 3. The support member 202 is made of alumina containing a 0.03 wt % or more amount of carbon capable of suppressing the diffusion of the niobium components contained in the resistance heating body 4. Specifically, the support member 202 of the electrostatic chuck shown in FIG. 5 is different from that of each electrostatic chuck in accordance with the present invention in that the support member 202 does not include two regions different in carbon content from each other.

In the comparative example shown in FIG. 5, the anti-dielectric breakdown characteristics in the periphery of the ESC electrodes 3 are sufficient in practical use. However, carbon contained in alumina of the support member 202 in contact with the ESC electrodes 3 decreases the volume resistivity of the support member 202, and accordingly, particularly in the case of being applied with the high voltage, the anti-dielectric breakdown characteristics in the vicinity of the ESC electrodes are inferior to that of the base of the electrostatic chuck in accordance with the present invention.

In each of the embodiments shown in FIGS. 1 to 4, the resistance heating body 4 embedded in the base 2 (2A, 2B) contains niobium or platinum. Niobium and platinum are materials similar in thermal expansion coefficient to alumina. Hence, the resistance heating body 4 contains niobium or platinum, whereby a difference in thermal expansion coefficient between the base 2 containing alumina and the resistance heating body 4 is decreased. Hence, a thermal strain caused between the resistance heating body 4 and the base 2 in the periphery thereof when the resistance heating body 4 generates heat can be reduced to a large extent. Since platinum is an expensive material, it is preferable that the resistance heating body 4 be made of niobium in terms of practical use.

The resistance heating body 4 may be a planar resistance heating body formed, for example, by coating a raw material paste containing niobium, and so on. However, it is more preferable that the resistance heating body 4 be a coil-like resistance heating body. The resistance heating body 4 is the coil-like resistance heating body coiled from a raw material wire containing niobium, whereby the resistance heating body 4 generates heat three-dimensionally in the base 2. Accordingly, the coil-like resistance heating body can enhance in-plane uniformity of the substrate heating more than the planar resistance heating body. Moreover, since the coil-like resistance heating body is manufacturing by processing a homogeneous wire, variations of heat generation characteristics of the electrostatic chuck with a heater for each lot are small. Moreover, a coil pitch and the like are locally varied, whereby a temperature distribution on the substrate mounting surface can be adjusted easily. Furthermore, adhesion of the coil-like resistance heating body to the base 2 can be enhanced more than that of the planar resistance heating body.

It is preferable that the ESC electrodes 3 be ones containing tungsten carbide (WC) and 10% or more of alumina. The ESC electrodes contain tungsten carbide as a main component, whereby the volume resistivity of alumina in the vicinity of the ESC electrodes can be increased since the diffusion of constituent substances of the ESC electrodes into alumina is extremely small. From this fact, the insulating characteristics in the case of being applied with the high voltage are enhanced, and the detachment characteristics for the substrate to be sucked are enhanced as the resistance of the dielectric layer is being increased. Moreover, the ESC electrodes are the ones containing 10% or more of alumina, whereby the adhesion of the portion of the ESC electrodes 3 is enhanced. It is preferable to set an upper limit of a content of alumina contained in the ESC electrodes at approximately 30 wt % or less from a viewpoint of decreasing electric resistance of the portion of the ESC electrodes to an extent not to hinder a high-frequency current.

For the ESC electrodes 3, ones can also be used, which are formed, for example, by printing a printing paste containing mixed powder of predetermined amounts of alumina and tungsten carbide into a planar shape including a mesh shape, a comb shape, a spiral shape, and the like. Note that the ESC electrodes may be either unipolar or bipolar, and the present invention is suitably applicable even to plural-polar ESC electrodes. Particularly in the bipolar and plural-polar ESC electrodes, the present invention functions more suitably.

Next, a description will be made of a manufacturing method of the electrostatic chuck with a heater in accordance with the present invention. Note that the description will be made below of the manufacturing method of the electrostatic chuck with a heater by representatively using the example of the embodiment shown in FIG. 1 and FIG. 2. Moreover, when the electrostatic chuck is manufactured, a process advances in a positional relationship in which FIG. 2 is inverted upside-down. Specifically, the dielectric layer 21 of the base 2 is fabricated, the ESC electrodes 3 are formed on the dielectric layer 21, and the support member 22 is then formed on the ESC electrodes 3.

(Fabrication of Dielectric Layer)

First, the dielectric layer 21 is fabricated. As described above, the dielectric layer 21 is made of alumina with a carbon content of 100 wt ppm or less.

As raw material powder of ceramics, alumina powder with a high purity (for example, 99.7%) and raw material powder of MgO as sintering aids are used. To the raw material powder of ceramics, there are added polyvinyl alcohol (PVA) as a binder, water, a dispersant, and the like. Then, a resultant is mixed by a trommel for a predetermined time (for example, 16 hours), and raw material slurry is prepared. The raw material slurry is sprayed and dried by using a spray dryer to obtain an alumina granulated powder. Thereafter, the alumina granulated powder is preliminary fired. Such preliminary firing is treatment in which the dried raw material is held in the air, for example, at 500° C. for five hours, and by the preliminary firing, alumina granulated powder from which the binder is removed is obtained. Since carbon is contained in the binder, the carbon content in the dielectric layer 21 can be reduced to 100 wt ppm or less by removing the binder from the alumina granulated powder as mentioned above.

Next, the alumina granulated powder is filled into a metal mold, and is subjected to press forming with a predetermined pressure, and an alumina compacted body is fabricated. Subsequently, this alumina compacted body is set into a carbon-made sheath, and is fired by using a hot press firing method. The firing is performed in a nitrogen atmosphere in a state where a predetermined pressure is applied to the sheath, whereby an alumina sintered body is obtained.

Next, the above-described alumina sintered body is subjected to a grinding process, and a disc with a predetermined size (for example, ø340 mm, and thickness of 6 mm) is fabricated. In this case, one of a front surface and back surface of the disc is finished up to a smooth surface by the grinding process.

(Fabrication of Esc Electrode)

Tungsten carbide powder, 10 wt % or more of alumina powder and a binder, which are the materials of the ESC electrodes 3, are mixed together to prepare a printing paste. Then, this printing paste is coated on the smooth surface of the alumina sintered body described above by a screen printing method, followed by drying, whereby the ESC electrodes 3 are formed.

(Formation of Esc Electrode Neighborhood of Support Member)

The alumina sintered body on which the ESC electrodes 3 are formed is set in a metal mold. In this metal mold, the alumina granulated powder in which the carbon content is reduced in advance by the preliminary firing is filled onto the alumina sintered body, and is subjected to the press forming with a predetermined pressure. In such a way, an alumina compacted body of the ESC electrode neighborhood 22a of the support member 22 shown in FIG. 2 is formed in the metal mold.

(Formation of Upper Side of Lower Region)

Next, in this metal mold, alumina granulated powder with a carbon content of 0.03 wt % or more, which is not subjected to the preliminary firing, is filled onto the above-described alumina compacted body of the ESC electrode neighborhood 22, and is subjected to the press forming with a predetermined pressure. In such a way, in the metal mold, there is formed the alumina compacted body of a portion on an upper side of the resistance heating body 4 in the lower region 22b of the support member 22 shown in FIG. 2.

(Disposition of Resistance Heating Body)

Next, on the alumina compacted body in the metal mold, the niobium-made resistance heating body 4 having the mesh shape, the sheet shape or the coil shape is mounted. Moreover, the connection members for connecting to the feeding members are mounted on predetermined positions on the resistance heating body.

(Formation of Lower Side of Lower Region)

Next, the alumina granulated powder with a carbon content of 0.03 wt % or more, which is not subjected to the preliminary firing, is filled onto the alumina compacted body, the resistance heating body 4 and the connection members in the metal mold, and is subjected to the press forming while being pressed with a predetermined pressure. In such a way, in the metal mold, there is formed the lower side portion of the resistance heating body 4 in the lower region 22b of the support member 22 shown in FIG. 2.

As described above, the alumina compacted body that becomes the base 2 is fabricated.

Subsequently, the above-described alumina compacted body that becomes the base 2 is set into the carbon-made sheath, and is sintered by using the hot press method or the like. The sintering is performed in the nitrogen atmosphere under predetermined uniaxial pressurization, and is performed by holding the sheath at the high temperature for a predetermined time (that is, the hot press firing). Thereafter, the surface of the alumina sintered body (that is, the dielectric layer) as a portion having been subjected to the two firing processes is subjected to a plane grinding process by a diamond grindstone, and the thickness of the alumina sintered body is adjusted. Moreover, a side surface of the alumina sintered body is ground, and necessary drilling process and attachment of the power feeding members 6 and 7 are performed, whereby the electrostatic chuck 1 with a heater is completed.

In an example of the manufacturing method, which is described above, the adjustment of the carbon amount in the ESC electrode neighborhood 22a of the base 2 is performed by preliminary firing the alumina granulated powder. Moreover, the adjustment of the carbon amount in the lower region 22b of the base 2 is performed by adjusting the amount of the binder to be added to the raw material powder of ceramics. However, the adjustment of the carbon amount in the ESC electrode neighborhood 22a and the adjustment of the carbon amount in the lower region 22b are not limited to the above-described methods.

For example, mixed powder is used, which is formed of the alumina granulated powder in which the carbon amount is reduced by being subjected to the preliminary firing, and the alumina granulated powder in which the binder (carbon content) remains without being subjected to the preliminary firing, and a mixing ratio in the mixed powder is adjusted, thus making it possible to adjust the carbon amount in the ESC electrode neighborhood 22a or the lower region 22b.

Moreover, the alumina granulated powder in which the carbon amount is reduced by being subjected to the preliminary firing, and the alumina granulated powder in which the binder (carbon content) remains without being subjected to the preliminary firing, are sequentially charged into the metal mold for forming the base, and thereafter, the hot pressing is performed therefore, thus also making it capable to adjust the carbon amount in the ESC electrode neighborhood 22a or the lower region 22b by the diffusive movement of the binder at the time of this hot pressing.

EXAMPLES

In examples to be described below, two types of the alumina granulated powder were prepared in order to adjust the carbon content in alumina of the base. One is the alumina granulated powder subjected to the preliminary firing, and the other is the alumina granulated powder without being subjected to the preliminary firing.

For the former alumina granulated powder subjected to the preliminary firing, as the raw material powder of ceramics, the alumina powder (particle diameter: 1 μm) with a purity of 99.7% and the raw material powder of MgO as the sintering aids were used. Note that the content of MgO in the raw material powder of ceramics was set at 0.04%. To the raw material powder of ceramics, there were added polyvinyl alcohol (PVA) (ratio to raw material of ceramics: 2 wt %) as the binder, water, and the dispersant. Then, a resultant was mixed by the trommel for 16 hours, and slurry was prepared. The obtained slurry was sprayed and dried by using the spray dryer to obtain the alumina granulated powder. Thereafter, the alumina granulated powder was held at 500° C. for five hours by preliminary firing to remove the binder wherefrom, whereby the alumina granulated powder subjected to the preliminary firing with an average diameter of approximately 80 μm were prepared.

For the latter alumina granulated powder without being subjected to the preliminary firing, above-mentioned processes for the alumina granulated powder subjected to the preliminary firing were performed until obtaining the alumina granulated powder. Then, the preliminary firing to the obtained alumina granulated powder was not performed, whereby alumina granulated powder without being subjected to the preliminary firing were prepared.

Example 1

Example 1 is an example where a lower end of the ESC electrode neighborhood of the base 2 is located above the resistance heating body, and the periphery of the resistance heating body is formed of the lower region. Example 1 corresponds to the embodiment shown in FIG. 1.

First, an alumina sintered body that becomes the dielectric layer was fabricated. For this purpose, the alumina powder (particle diameter: 1 μm) with a purity of 99.7% and the raw material powder of MgO as the sintering aids were used. Note that the content of MgO in the raw material powder of ceramics was set at 0.04%. To the raw material powder of ceramics, there were added polyvinyl alcohol (PVA) as the binder, water, and the dispersant. Then, a resultant was mixed by the trommel for 16 hours, and slurry was prepared. The obtained slurry was sprayed and dried by using the spray dryer, and thereafter, was held at 500° C. for five hours to then remove the binder, whereby the granulated powder with an average diameter of approximately 80 μm were prepared. The alumina granulated powder were filled into the metal mold, and were subjected to the press forming with a pressure of 200 kg/cm². Subsequently, the compacted body thus obtained was set into the carbon-made sheath, and was fired by using the hot press firing method. The compacted body was fired in the nitrogen pressurization atmosphere (150 kPa) under pressurization of 100 kg/cm², was heated up at a rate of 300° C./h, and was held at 1600° C. for two hours, whereby the alumina sintered body of the portion corresponding to the dielectric layer was obtained.

The alumina sintered body thus obtained was subjected to the grinding process, and a disc with a diameter of ø300 mm and a thickness of 6 mm was fabricated. In this case, one surface of the disc was finished up by the grinding process so as to become a smooth surface with a surface roughness Ra of 0.8 μm or less.

Next, the ESC electrodes were formed on the alumina sintered body. In order to form the ESC electrodes, WC, alumina (content: 20%), and terpineol as the binder were mixed together to prepare the printing paste, and by the screen printing method, the ESC electrodes with a whole diameter of ø290 mm and a thickness of 10 μm were formed on the smooth surface of the above-described alumina sintered body, followed by drying.

Next, in order to make a portion that becomes the ESC electrode neighborhood 22a, the alumina sintered body on which the above-described printed ESC electrodes were formed was set in the metal mold, the alumina granulated powder subjected to the preliminary firing were filled thereonto, and a resultant was subjected to the press forming with a pressure of 200 kg/cm².

Next, in order to make a portion that becomes a part of the lower region, the alumina granulated powder without being subjected to the preliminary firing was filled onto the above-described alumina compacted body subjected to the preliminary firing, and a resultant was subjected to the press forming with a pressure of 200 kg/cm².

On the obtained alumina compacted body as a portion of the lower region, the coil-like resistance heating body (wire diameter: ø0.5 mm; wound diameter: ø3.0 mm) made of niobium was mounted. Moreover, end portions of the resistance heating body were inserted into through holes for the spherical niobium bonding members with a diameter of 4.0 mm, and the niobium bonding members were also mounted on the compacted body.

Thereafter, in order to make a portion that becomes the rest of the lower region, the alumina granulated powder was filled onto the alumina compacted body, the resistance heating body, and the bonding members, pressurization was performed with a pressure of 200 kg/cm², whereby the press forming was performed. By the processes described above, the alumina compacted body that becomes the base 2 was made.

Subsequently, the compacted body thus obtained was set into the carbon-made sheath, and was fired by using the hot press firing method. The compacted body was fired in the nitrogen pressurization atmosphere (150 kPa) under the pressurization of 100 kg/cm², was heated up at a rate of 300° C./h, and was held at 1600° C. for two hours. In such a way, the sintered body was obtained, in which the ESC electrodes and the resistance heating body were embedded.

Thereafter, the surface of the alumina sintered body having been subjected to the two firing processes was subjected to the plane grinding process by the diamond grindstone, and the thickness of the alumina sintered body, that is, a thickness from the embedded ESC electrodes to the surface was set at 0.3 mm. Moreover, the side surface of the sintered body was ground, and the necessary drilling process and attachment of terminals were performed, whereby the electrostatic chuck was completed.

Example 2

Example 2 is an example where the lower end of the ESC electrode neighborhood 22a of the base 2 is brought into contact with the resistance heating body. Example 2 corresponds to the embodiment shown in FIG. 3.

First, an alumina sintered body that becomes the dielectric layer was fabricated, and on this alumina sintered body, the ESC electrodes were formed. Fabrication conditions of the alumina sintered body and formation conditions of the ESC electrodes are the same as those of Example 1.

Thereafter, in order to make the portion that becomes the ESC electrode neighborhood 22a, the alumina sintered body on which the above-described ESC electrodes were formed was set on the metal mold, the alumina granulated powder subjected to the preliminary firing was filled there onto, and a resultant was subjected to the press forming with a pressure of 200 kg/cm².

On the alumina compacted body of the obtained portion that becomes the ESC electrode neighborhood 22a, a coil-like resistance heating body made of niobium and niobium bonding members were mounted. The resistance heating body made of niobium and the niobium bonding members are the same as those of Example 1.

Thereafter, in order to make a portion that becomes the lower region, the alumina granulated powder without being subjected to the preliminary firing was filled onto the alumina compacted body, the resistance heating body, and the bonding members, pressurization was performed with a pressure of 200 kg/cm², whereby the press forming was performed. By the processes described above, the alumina compacted body that becomes the base 2 was made.

Subsequently, the compacted body thus obtained was set into the carbon-made sheath, and was fired by using the hot press firing method. Firing conditions are the same as those of Example 1. In such a way, a sintered body in which the ESC electrodes and the resistance heating body were embedded was obtained.

Thereafter, the surface of the alumina sintered body having been subjected to the two firing processes was subjected to the plane grinding process by the diamond grindstone, and the thickness of the alumina sintered body, that is, a thickness from the embedded ESC electrodes to the surface was set at 0.3 mm. Moreover, the side surface of the sintered body was ground, and the necessary drilling process and attachment of terminals were performed, whereby the electrostatic chuck was completed.

Example 3

Example 4

Example 3 and Example 4 are examples where the lower end of the ESC electrode neighborhood of the base 2 is located below the resistance heating body 4, and Example 3 and Example 4 correspond to the embodiment shown in FIG. 4. Example 3 and Example 4 are different from each other in carbon content in the ESC electrode neighborhood 22a of the base.

Examples 3 and 4

First, an alumina sintered body that becomes the dielectric layer was fabricated in a similar way to Example 1.

Next, the ESC electrodes were formed on the above-described alumina sintered body in a similar way to Example 1.

Thereafter, in order to make a portion that becomes a part of the ESC electrode neighborhood 22a, the alumina sintered body on which the above-described printed ESC electrodes were formed was set in the metal mold, the alumina granulated powder subjected to the preliminary firing was filled there onto, and a resultant was subjected to the press forming with a pressure of 200 kg/cm².

Next, on the obtained alumina compacted body, a coil-like resistance heating body and niobium bonding members were mounted. The resistance heating body made of niobium and the niobium bonding members are the same as those of Example 1 and Example 2.

Thereafter, in order to make a portion that becomes the rest of the ESC electrode neighborhood 22a, the alumina granulated powder subjected to the preliminary firing was filled onto the alumina compacted body, the resistance heating body, and the bonding members, and the press forming was performed with a pressure of 200 kg/cm². In Example 3, the alumina granulated powder subjected to the preliminary firing was filled so as to obtain a thickness of 1.5 mm from a center in the thickness direction of the resistance heating body, and in Example 4, the alumina granulated powder subjected to the preliminary firing was filled so as to obtain a thickness of 4.5 mm.

Thereafter, in order to make a portion that becomes the lower region, the alumina granulated powder without being subjected to the preliminary firing was filled onto the obtained alumina compacted body so that the entire thickness could be 20 mm, and a resultant was subjected to the press forming with a pressure of 200 kg/cm². By the processes described above, the alumina compacted body that becomes the base 2 was made.

Subsequently, the compacted body thus obtained was set into the carbon-made sheath, and was fired by using the hot press firing method. Firing conditions are the same as those of Example 1 and Example 2. In such a way, a sintered body in which the ESC electrodes and the resistance heating body were embedded was obtained.

Thereafter, the surface of the alumina sintered body having been subjected to the two firing processes was subjected to the plane grinding process by the diamond grindstone, and the thickness of the alumina sintered body, that is, a thickness from the embedded ESC electrodes to the surface was set at 0.3 mm. Moreover, the side surface of the sintered body was ground, and the necessary drilling process and attachment of terminals were performed, whereby the electrostatic chuck was completed.

Comparative Example 1

Comparative Example 2

Comparative example 1 and Comparative example 2 are examples where the support member 22 of the base 2 does not include the region in which the carbon content is high.

Comparative example 1 and Comparative example 2 are different from each other in material of the ESC electrodes.

First, an alumina sintered body that becomes the dielectric layer was fabricated in a similar to Example 1.

Next, the ESC electrodes were formed on the alumina sintered body. In order to form the ESC electrodes, WC powder and alumina (content: 20%) were mixed with terpineol as the binder in Comparative example 1, and W powder was mixed therewith in Comparative example 2. In such a way, a printing paste was prepared in each of Comparative examples 1 and 2. Then, by the screen printing method, the ESC electrodes with a whole diameter of ø290 mm and a thickness of 10 μm were formed on the smooth surface of the alumina sintered body, followed by drying.

Thereafter, in order to make a portion that becomes a part of the support member, the alumina sintered body on which the above-described printed ESC electrodes were formed was set in the metal mold, the alumina granulated powder subjected to the preliminary firing was filled there onto, and a resultant was subjected to the press forming with a pressure of 200 kg/cm$^2$.

Next, on the obtained alumina compacted body, a coil-like resistance heating body made of niobium and niobium bonding members were mounted. The resistance heating body made of niobium and the niobium bonding members are the same as those of Examples 1 to 4.

Thereafter, in order to make a portion that becomes the rest of the support member, the alumina granulated powder subjected to the preliminary firing was filled onto the alumina compacted body, the resistance heating body, and the bonding members, and the press forming was performed with a pressure of 200 kg/cm$^2$. By the processes described above, the alumina compacted body that becomes the base 2 was made.

Subsequently, the compacted body thus obtained was set into the carbon-made sheath, and was fired by using the hot press firing method. Firing conditions are the same as those of Examples 1 to 4. In such a way, a sintered body in which the ESC electrodes and the resistance heating body were embedded was obtained.

Thereafter, the surface of the alumina sintered body having been subjected to the two firing processes was subjected to the plane grinding process by the diamond grindstone, and the thickness of the alumina sintered body, that is, a thickness from the embedded ESC electrodes to the surface was set at 0.3 mm. Moreover, the side surface of the sintered body was ground, and the necessary drilling process and attachment of terminals were performed, whereby the electrostatic chuck was completed.

Comparative Example 3

Comparative Example 4

Comparative Example 5

Comparative examples 3 to 5 are examples where the support member 22 of the base 2 is made of alumina with a large carbon content from an upper end thereof in contact with the ESC electrodes to a lower end thereof that becomes the lower surface of the base. Comparative example 3, Comparative example 4, and Comparative example 5 are different form one another immaterial of the ESC electrodes and in carbon content in the base.

Comparative Examples 3, 4 and 5

First, an alumina sintered body that becomes the dielectric layer was fabricated in a similar to Example 1.

Next, the ESC electrodes were formed on the alumina sintered body. In order to form the ESC electrodes, W powder was used in Comparative example 3, and WC powder and alumina (content: 20%) were used in Comparative examples 4 and 5. In each of Comparative examples 3, 4 and 5, such powder or mixture was mixed with terpineol as the binder to then prepare a printing paste. Then, by the screen printing method, the ESC electrodes with a whole diameter of ø290 mm and a thickness of 10 μm were formed on the smooth surface of the above-descried alumina sintered body, followed by drying.

Thereafter, in order to make a portion that becomes a part of the support member, the alumina sintered body on which the above-described printed ESC electrodes were formed was set in the metal mold. In each of Comparative examples 3 and 4, the alumina granulated powder without being subjected to the preliminary firing was filled onto the alumina sintered body, and in Comparative example 5, powder was filled there onto, in which the alumina granulated powder without being subjected to the preliminary firing and the alumina granulated powder subjected to the preliminary firing were mixed in a ratio of 5:1. Then, a resultant in each Comparative example was subjected to the press forming with a pressure of 200 kg/cm$^2$.

On the obtained alumina compacted body, a coil-like resistance heating body made of niobium and niobium bonding members were mounted. The resistance heating body made of niobium and the niobium bonding members are the same as those of Examples 1 to 4 and Comparative examples 1 and 2.

Thereafter, in order to make a portion that becomes the rest of the support member, in each of Comparative examples 3 and 4, the alumina granules without being subjected to the preliminary firing were filled onto the alumina compacted body, the resistance heating body, and the bonding members, and in Comparative example 5, powder was filled there onto, in which the alumina granulated powder without being subjected to the preliminary firing and the alumina granulated powder subjected to the preliminary firing were mixed in a ratio of 5:1. Then, a resultant in each Comparative example was subjected to the press forming with a pressure of 200 kg/cm$^2$.

Subsequently, the compacted body thus obtained was set into the carbon-made sheath, and was fired by using the hot press firing method. Firing conditions are the same as those of Examples 1 to 4 and Comparative examples 1 and 2. In such a way, a sintered body in which the ESC electrodes and the resistance heating body were embedded was obtained.

Thereafter, the surface of the alumina sintered body having been subjected to the two firing processes was subjected to the plane grinding process by the diamond grindstone, and the thickness of the alumina sintered body, that is, a thickness from the embedded ESC electrodes to the surface was set at 0.3 mm. Moreover, the side surface of the sintered body was ground, and the necessary drilling process and attachment of terminals were performed, whereby the electrostatic chuck was completed.

Comparative Example 6

Comparative example 6 is an example where the base 2 is made of alumina with a large carbon content from the upper surface thereof to the lower surface thereof.

Comparative Example 6

First, an alumina sintered body that becomes the dielectric layer was fabricated. For this purpose, as the raw material powder of ceramics, the alumina powder (particle diameter: 1 μm) with a purity of 99.7% and the raw material powder of MgO as the sintering aids were used. Note that the content of MgO in the raw material powder of ceramics was set at 0.04%. To the raw material powder of ceramics, there were added polyvinyl alcohol (PVA) ((ratio to raw material of ceramics: 2 wt %) as the binder, water, and the dispersant. Then, a resultant was mixed by the trommel for 16 hours, and slurry was prepared. The obtained slurry was sprayed and dried by using the spray dryer, whereby the granules were prepared. Specifically, the heating treatment for removing the binder was not performed.

The alumina granules were filled into the metal mold, and were subjected to the press forming with a pressure of 200 kg/cm². Subsequently, the compacted body thus obtained was set into the carbon-made sheath, and was fired by using the hot press firing method. The compacted body was fired in the nitrogen pressurization atmosphere (150 kPa) under pressurization of 100 kg/cm², was heated up at a rate of 300° C./h, and was held at 1600° C. for two hours, whereby the alumina sintered body of the portion corresponding to the dielectric layer was obtained.

Next, the alumina sintered body thus obtained was subjected to the grinding process, and a disc with a diameter of ø300 mm and a thickness of 6 mm was fabricated. In this case, one surface of the disc was finished up by the grinding process so as to become a smooth surface with a surface roughness Ra of 0.8 μm or less.

Next, the ESC electrodes were formed on the alumina sintered body. In order to form the ESC electrodes, WC, alumina (content: 20%), and terpineol as the binder were mixed together to prepare the printing paste, and by the screen printing method, the ESC electrodes with a whole diameter of ø290 mm and a thickness of 10 μm were formed on the smooth surface of the alumina sintered body, followed by drying.

Thereafter, in order to make a portion that becomes a part of the support member, the alumina sintered body on which the above-described printed ESC electrodes were formed was set in the metal mold, the alumina granulated powder without being subjected to the preliminary firing were filled there onto, and a resultant was subjected to the press forming with a pressure of 200 kg/cm².

On the obtained alumina compacted body, a coil-like resistance heating body made of niobium and niobium bonding members were mounted. The resistance heating body made of niobium and the niobium bonding members are the same as those of Examples 1 to 4 and Comparative examples 1 to 5.

Thereafter, in order to make a portion that becomes the rest of the support member, the alumina granulated powder was filled onto the alumina compacted body, the resistance heating body, and the bonding members, and pressurization was performed with a pressure of 200 kg/cm².

Subsequently, the compacted body thus obtained was set into the carbon-made sheath, and was fired by using the hot press firing method. Firing conditions are the same as those of Examples 1 to 4 and Comparative examples 1 to 5. In such a way, a sintered body in which the ESC electrodes and the resistance heating body were embedded was obtained.

Thereafter, the surface of the alumina sintered body having been subjected to the two firing processes was subjected to the plane grinding process by the diamond grindstone, and the thickness of the alumina sintered body, that is, a thickness from the embedded ESC electrodes to the surface was set at 0.3 mm. Moreover, the side surface of the sintered body was ground, and the necessary drilling process and attachment of terminals were performed, whereby the electrostatic chuck was completed.

Figure 6:
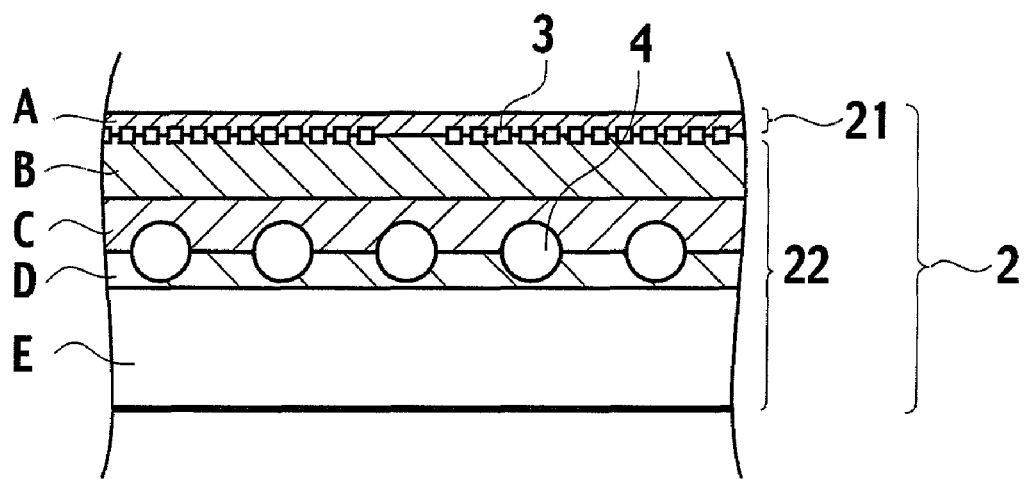
FIG. 6 is an explanatory view of an example.

With regard to these electrostatic chucks of Examples 1 to 4 and Comparative examples 1 to 6, the member configurations and the carbon amounts are shown in Table 1. Moreover, with regard to these electrostatic chucks, the anti-dielectric breakdown characteristics between the ESC electrodes, the existence of the niobium diffusion into the periphery of the resistance heating body, the heater resistance values, and the uniform heating performances were investigated, and results of the investigation are also shown in Table 1-1 and Table 1-2. Note that, in Table 1, the configurations of ceramics in the base 2 correspond to regions shown in a cross-sectional view of the base, which is shown in FIG. 6. Reference numeral A denotes the dielectric layer 21, reference numeral B denotes the region (ESC electrode neighborhood) where the support member is in contact with the ESC electrodes 3, reference numeral C denotes the region in contact with an upper half of the resistance heating body 4 from the ESC electrode neighborhood in the lower region of the support member, reference numeral D denotes the region in the vicinity of a lower half of the resistance heating body 4 in the lower region of the support member, and reference numeral E denotes the region from the region D to the lower surface in the lower region of the support member. In Table 1, with regard to these respective regions A to E, examples using the alumina granulated powder subjected to the preliminary firing are expressed as "white" derived from a color of alumina itself, and examples using the alumina granulated powder without being subjected to the preliminary firing are expressed as "black" derived from a color of carbon contained in alumina.

TABLE 1

|  |  | Example | | | | Comparative example 1 |
|---|---|---|---|---|---|---|
|  |  | Example 1 | Example 2 | Example 3 | Example 4 |  |
| Raw material powder | A (dielectric layer) | White | White | White | White | White |
|  | B (support member: ESC electrode neighborhood) |  |  |  |  |  |
|  | C (support member: above resistance heating body) | Black |  |  |  |  |
|  | D (support member: below resistance heating body) |  | Black |  |  |  |
|  | E (support member: below D) |  |  | Black | Black |  |
| Dielectric layer | Binder amount in raw material slurry [wt %] | 2 | 2 | 2 | 2 | 2 |
|  | Carbon amount in sintered body [ppm] | less than 100 ppm | less than 100 ppm | less than 100 ppm | less than 100 ppm | less than 100 ppm |
|  | Volume resistivity 23° C. [Ω·cm] | more than $1 \times 10^{17}$ | more than $1 \times 10^{17}$ | more than $1 \times 10^{17}$ | more than $1 \times 10^{17}$ | more than $1 \times 10^{17}$ |
|  | 200° C. [Ω·cm] | $1 \times 10^{16}$ | $2 \times 10^{16}$ | $8 \times 10^{15}$ | $1 \times 10^{16}$ | $9 \times 10^{16}$ |

TABLE 1-continued

| | | | | | | |
|---|---|---|---|---|---|---|
| Base | Carbon amount in vicinity of ESC electrode [wt %] | 0.13 | 0.10 | 0.04 | 0.01 | less than 100 ppm |
| | Carbon amount in vicinity of resistance heating body [wt %] | 0.20 | 0.15 | 0.10 | 0.03 | less than 100 ppm |
| | ESC electrode material | WC + $Al_2O_3$ 20% | WC + $Al_2O_3$ 20% | WC + $Al_2O_3$ 20% | WC + $Al_2O_3$ 20% | WC + $Al_2O_3$ 20% |
| Result | Interelectrode dielectric breakdown @6 kV | None | None | None | None | None |
| | Nb diffusion | None | None | None | None | Present |
| | Heater resistance value (designed value: 8 Ω) [Ω] | 8 | 8 | 8 | 8 | 12 |
| | Uniform heating resistance (designed value: 3° C.) [° C.] | 3 | 3 | 3 | 3 | 10 |

| | | Example | | | | |
|---|---|---|---|---|---|---|
| | | Comparative example 1 | Comparative example 3 | Comparative example 4 | Comparative example 5 | Comparative example 6 |
| Raw material powder | A (dielectric layer) | White | White | White | White | Black |
| | B (support member: ESC electrode neighborhood) | | Black | Black | Black | |
| | C (support member: above resistance heating body) | | | | | |
| | D (support member: below resistance heating body) | | | | | |
| | E (support member: below D) | | | | | |
| Dielectric layer | Binder amount in raw material slurry | 2 [wt %] | 2 [wt %] | 2 [wt %] | 2 [wt %] | 2 [wt %] |
| | Carbon amount in sintered body [ppm] | less than 100 ppm | less than 100 ppm | less than 100 ppm | less than 100 ppm | 0.2 |
| | Volume resistivity 23° C. [Ω · cm] | more than $1 \times 10^{17}$ | more than $1 \times 10^{17}$ | more than $1 \times 10^{17}$ | more than $1 \times 10^{17}$ | more than $1 \times 10^{17}$ |
| | 200° C. [Ω · cm] | $2 \times 10^{16}$ | $1 \times 10^{16}$ | $9 \times 10^{15}$ | $2 \times 10^{16}$ | $1 \times 10^{13}$ |
| Base | Carbon amount in vicinity of ESC electrode [wt %] | less than 100 ppm | 0.18 | 0.18 | 0.15 | 0.22 |
| | Carbon amount in vicinity of resistance heating body [wt %] | less than 100 ppm | 0.20 | 0.19 | 0.15 | 0.21 |
| | ESC electrode material | W | W | WC + $Al_2O_3$ 20% | WC + $Al_2O_3$ 20% | WC + $Al_2O_3$ 20% |
| Result | Interelectrode dielectric breakdown @6 kV | Occured | Occured | Occured | Occured | Occured |
| | Nb diffusion | Present | None | None | None | None |
| | Heater resistance value (designed value: 8 Ω) [Ω] | 10 | 8 | 8 | 8 | 8 |
| | Uniform heating resistance (designed value: 3° C.) [° C.] | 8 | 3 | 3 | 3 | 3 |

As understood from Table 1, in Examples 1 to 4, in the regions B to E corresponding to the support member of the base, the carbon amount differs between the ESC electrode neighborhood (B) and the regions below the ESC electrode neighborhood. As a result, since the carbon amount in the ESC electrode neighborhood is small, the dielectric breakdown between the ESC electrodes did not occur even if a voltage of 6 kV was applied therebetween. Moreover, since the carbon amount in the periphery of the niobium coil is large, the diffusion of the niobium coil did not occur, the heater resistance value became as designed, and the uniform heating performance that was excellent. Moreover, since the ESC electrodes are made of tungsten carbide and alumina, the electrostatic chuck was superior in adhesion of the portion of the ESC electrodes.

As opposed to this, in Comparative examples 1 and 2, the carbon contents were small in both of the dielectric layer and support member f the base. Accordingly, niobium was diffused into alumina in the periphery of the niobium coil, the heater resistance value was increased more than a designed value, and the uniform heating performance that was inferior was brought.

Moreover, in Comparative examples 3 to 5, since the carbon amount in the support member regions (B to E) of the base was large, the anti-dielectric breakdown characteristics of the ESC electrode portion were inferior to those of Examples though the niobium diffusion was suppressed.

In Comparative example 6, since the carbon contents in both of the dielectric layer and support member of the base were large, the diffusion of the niobium coil did not occur. However, the volume resistivity of the dielectric layer was not sufficient as a member of the Coulomb-type electrostatic chuck, the detachment characteristics were poor, and the dielectric breakdown occurred under application of a high voltage. Note that, as understood from comparison between Comparative example 1 and Comparative example 2, in the present invention, WC and alumina are used as the materials of the ESC electrodes to then form the mixture electrodes, whereby the diffusion into alumina in the periphery of the ESC electrode material can be suppressed, thus making it possible to enhance the anti-dielectric breakdown characteristics.

While preferred embodiments of the present invention have been described using specific terms, such description is for illustrative purposes, and it is to be understood that changes and variations may be made without departing from the sprit or scope of the claims.

What is claimed is:
1. An electrostatic chuck with a heater, comprising:
a base formed of a sintered body containing alumina;
an electrostatic chuck electrode provided in an upper portion side in the base; and
a resistance heating body embedded in a lower portion side in the base, wherein the base is composed of a dielectric layer from the electrostatic chuck electrode to an upper surface of the base, and of a support member from the electrostatic chuck electrode to a lower surface of the base, a carbon content in the dielectric layer is 100 wt ppm or less, a carbon content in the support member differs between an electrostatic chuck electrode neighborhood in contact with the dielectric layer and a lower region below the electrostatic chuck electrode neighborhood, the carbon content in the electrostatic chuck electrode neighborhood of the support member is 0.13 wt % or less, the carbon content in the lower region of the support member is 0.03 wt % or more and 0.5 wt % or less, the carbon content in the electrostatic chuck electrode neighborhood is smaller than the carbon content in the lower region, and the resistance heating body contains niobium or platinum.

2. The electrostatic chuck with a heater according to claim 1, wherein the electrostatic chuck electrode contains 10 wt % or more and 30 wt % or less of alumina, and tungsten carbide.

3. A manufacturing method of an electrostatic chuck with a heater, the electrostatic chuck comprising a base formed of a sintered body containing alumina, an electrostatic chuck electrode embedded in the base, and a resistance heating body embedded in the base, the method comprising the steps of:

forming a dielectric layer by shaping an alumina granulated powder obtained by preliminarily firing a raw material powder of alumina and a granulated powder comprising a binder in air at 500° C. or more, the dielectric layer having a carbon content of 0.01 wt % or less;

forming the electrostatic chuck electrode on a surface of the dielectric layer;

fabricating an alumina compacted body by stacking raw material which forms a support member supporting the dielectric layer on the surface of the dielectric layer with the electrostatic chuck electrode formed thereon; and firing the alumina compacted body, wherein the step of fabricating an alumina compacted body includes a step of arranging an alumina granulated powder that is not subjected to preliminary firing after arranging the alumina granulated powder subjected to preliminary firing in advance, on the surface of the dielectric layer where the electrostatic chuck electrode is formed, and wherein the alumina granulated powder that is not subjected to the preliminary firing is arranged on a side apart from the electrostatic chuck electrode more than the alumina granulated powder subjected to preliminary firing in advance.

* * * * *